United States Patent
Yun et al.

(10) Patent No.: US 6,943,719 B2
(45) Date of Patent: Sep. 13, 2005

(54) ANALOG-TO-DIGITAL CONVERTER FOR IMAGE SENSOR

(75) Inventors: Young-Hwan Yun, Yongin-shi (KR); Dong-Hun Lee, Yongin-shi (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 110 days.

(21) Appl. No.: 10/644,893

(22) Filed: Aug. 21, 2003

(65) Prior Publication Data

US 2004/0046685 A1 Mar. 11, 2004

(30) Foreign Application Priority Data

Aug. 22, 2002 (KR) .................................. 10-2002-0049783

(51) Int. Cl.⁷ .............................................. H03M 1/12
(52) U.S. Cl. ..................................... 341/155; 257/222
(58) Field of Search ................................ 341/155, 137; 348/294, 295, 300, 301, 302, 303, 308; 257/222; 250/208.1

(56) References Cited

U.S. PATENT DOCUMENTS 6,115,065 A * 9/2000 Yadid-Pecht et al. ....... 348/308
6,552,746 B1 * 4/2003 Yang et al. .................. 348/308

* cited by examiner

Primary Examiner—Brian Young
(74) Attorney, Agent, or Firm—Volentine Francos & Whitt, PLLC

(57) ABSTRACT

A signal processing circuit outputs a digital word responsive to incident light, and includes an analog integrated circuit having a first input terminal receiving a first analog signal during a first active period of a first switching signal and a second input terminal receiving a time varying reference signal; an inverter circuit inverting and amplifying an output of the analog integrated circuit responsive to an activated enable signal; and an output circuit generating the digital word. During a second active period of the first switching signal, the first input terminal is coupled to a data line for receiving a second analog signal corresponding to image charges of an image input element. The enable signal is deactivated between end points of the first and second active periods of the first switching signal.

20 Claims, 7 Drawing Sheets

ANALOG-TO-DIGITAL CONVERTER FOR IMAGE SENSOR

BACKGROUND OF THE INVENTION

1. Field of the Invention

The present invention relates to electronic devices for sensing, capturing, and signal processing, and more particularly to an image sensor fabricated by a standard complementary metal oxide semiconductor (CMOS) process.

A claim of priority is made to Korean Patent Application No. 2002-0049783, filed Aug. 22, 2002, the contents of which are incorporated herein by reference.

2. Description of the Related Art

CMOS image arrays make it possible to handle high quality images with a video camera that may be variously used in camcorder apparatuses, scanners for fax machines, and portable apparatuses for video conference or professional TV broadcasting, for example.

The presence of multimedia communication has resulted in an increasing demand for low-cost solid state image sensors for use in computers and communication equipment in order to realize practical videotelephones. Image input devices have become key elements of teleconference and multimedia applications. In recent years, CMOS image sensors have become attractive as a candidate for image input devices. Also, CMOS image sensors may be applied to robotics, machine vision, security surveillance, automobile, and personal identification (ID) systems that use fingerprint analysis and retina scanning.

In a CMOS image sensor, a signal processor and an imager can be integrated on the same chip. Therefore, a smart design can be achieved and the CMOS image sensor can be implemented as a single-chip image capture system. Since a CMOS imager can be fabricated in CMOS process lines without modification of the process lines, such fabrication is low-cost as compared to fabrication costs of conventional charge coupled devices (CCD).

Recently, the use of portable electronic apparatuses has been increasing. Because portable electronic apparatuses receive power from a battery, electronic apparatus developers have focused efforts on developing low-power consumption portable electronic apparatuses. Accordingly, there is a need for a low-power consumption image sensor for use in portable electronic apparatuses which require image capture.

It is well known that light is successively varied analog data. The analog data must be converted into digital data so as to be processed into a discrete signal. A CMOS image apparatus employs an analog-to-digital converter for detecting light as an analog signal, in order to convert the analog signal into digital data. By saving power consumed by the analog-to-digital converter, power consumed by the CMOS image apparatus as a whole may be saved.

SUMMARY OF THE INVENTION

The present invention provides an analog-to-digital converter for a power-saving image sensor.

According to a first aspect of the present invention, a signal processing circuit includes an analog integrated circuit having a first input terminal for receiving a first-level analog signal during a first active period of a first switching signal and a second input terminal for receiving a time varying reference signal; an inverter circuit for inverting and amplifying an output of the analog integrated circuit in response to an activated enable signal; and an output circuit for generating a digital word indicative of a time period defined by a start signal and an end signal corresponding to the transition of an output of the inverter circuit. The first input terminal is coupled to a data line for receiving a second-level analog signal corresponding to image charges of an image input element during a second active period of the first switching signal. The enable signal is deactivated between an end point of the first active period of the first switching signal and an end point of the second active period.

The inverter circuit includes a first transistor having a first electrode coupled to a power supply voltage, a second electrode, and a gate coupled to an output of the analog integrated circuit; a second transistor having a first electrode coupled to the second electrode of the first transistor, a second electrode, and a gate coupled to the output of the analog integrated circuit; and a third transistor having a first electrode coupled to the second electrode of the second transistor, a second electrode coupled to a ground voltage, and a gate coupled to the enable signal.

The first transistor is a PMOS transistor, and the second and third transistors are NMOS transistors. In this case, the enable signal is active high.

In accordance with a second aspect of the invention, the inverter circuit includes a first transistor having a first electrode coupled to a power supply voltage, a second electrode, and a gate coupled to the enable signal; a second transistor having a first electrode coupled to the second electrode of the first transistor, a second electrode, and a gate coupled to an output of the analog integrated circuit; and a third transistor having a first electrode coupled to the second electrode of the second transistor, a second electrode coupled to a ground voltage, a gate coupled to the output of the analog integrated circuit.

The first and second transistors are PMOS transistors, and the third transistor is an NMOS transistor.

The time varying reference signal is a ramp signal varied with a predetermined inclination or slope in response to the start signal.

BRIEF DESCRIPTION OF THE DRAWINGS

The above and other aspects and advantages of the present invention will become readily apparent from the detailed description that follows, with reference to the accompanying drawings, in which.

DETAILED DESCRIPTION OF THE INVENTION

Figure 1:
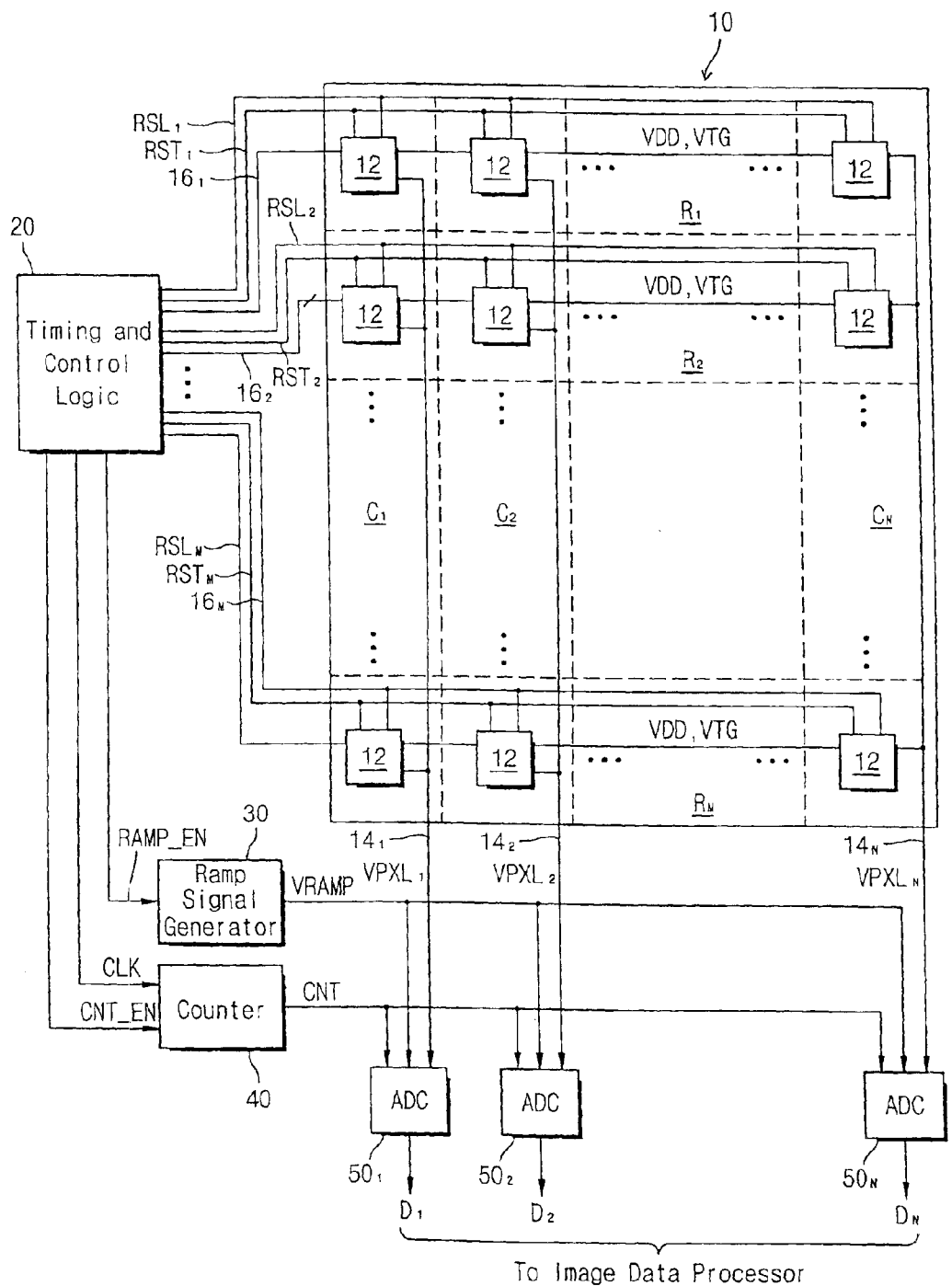
FIG. 1 shows an active pixel CMOS image circuit according to the present invention.

A CMOS image circuit according to an embodiment of the present invention is now described below with reference to FIG. 1. Referring to FIG. 1, a sensor array 10 includes a plurality of cells (pixels) 12 arranged at arrays of rows $R_1$–$R_M$ and columns $C_1$–$C_N$. In order to read images from all cells 12 in one row, the cells are activated at the same time. A timing and control logic block 20 provides row selection signals ROWSEL on row selection lines $RSL_1$–$RSL_M$ so as to select an activated row. A reset signal RESET on reset lines $RST_1$–$RST_M$ as generated by control logic block 20 is also provided to the cells 12. A charge induced by light from the respective active cells 12 is read out, as a corresponding voltage, on respective column data lines $14_1$–$14_N$ coupled to the cells 12 in respective columns $C_1$–$C_N$. At a specific time, a voltage on respective columns $14i$ corresponds to an image charge of only one activated cell in an associated column Ci and an activated row. Signal lines $16_1$–$16_M$ transfer voltages VDD and VTG for driving the cells 12 from the timing and control logic block 20 to the cells 12.

A ramp signal generator 30 generates a ramp signal VRAMP in response to a ramp enable signal RAMP_EN from the timing and control logic block 20. The ramp signal VRAMP is a time varying reference signal that is varied with a predetermined inclination or slope. A counter 40 counts the period of a clock signal CLK in response to a counter enable signal CNT_EN.

Analog-to-digital converters (ADCs) $50_1$–$50_N$ are connected to lower portions of the columns $C_1$–$C_N$, respectively. Analog-to-digital converters $50_J$ receive a voltage $VPXL_J$ on the column data line $14_J$, a ramp signal VRAMP generated from the ramp signal generator 30, and an output CNT of the counter 40 to output a digital word $D_J$. Digital words $D_J$ outputted from the analog-to-digital converters $50_J$ are provided to an image data processor.

Figure 2:
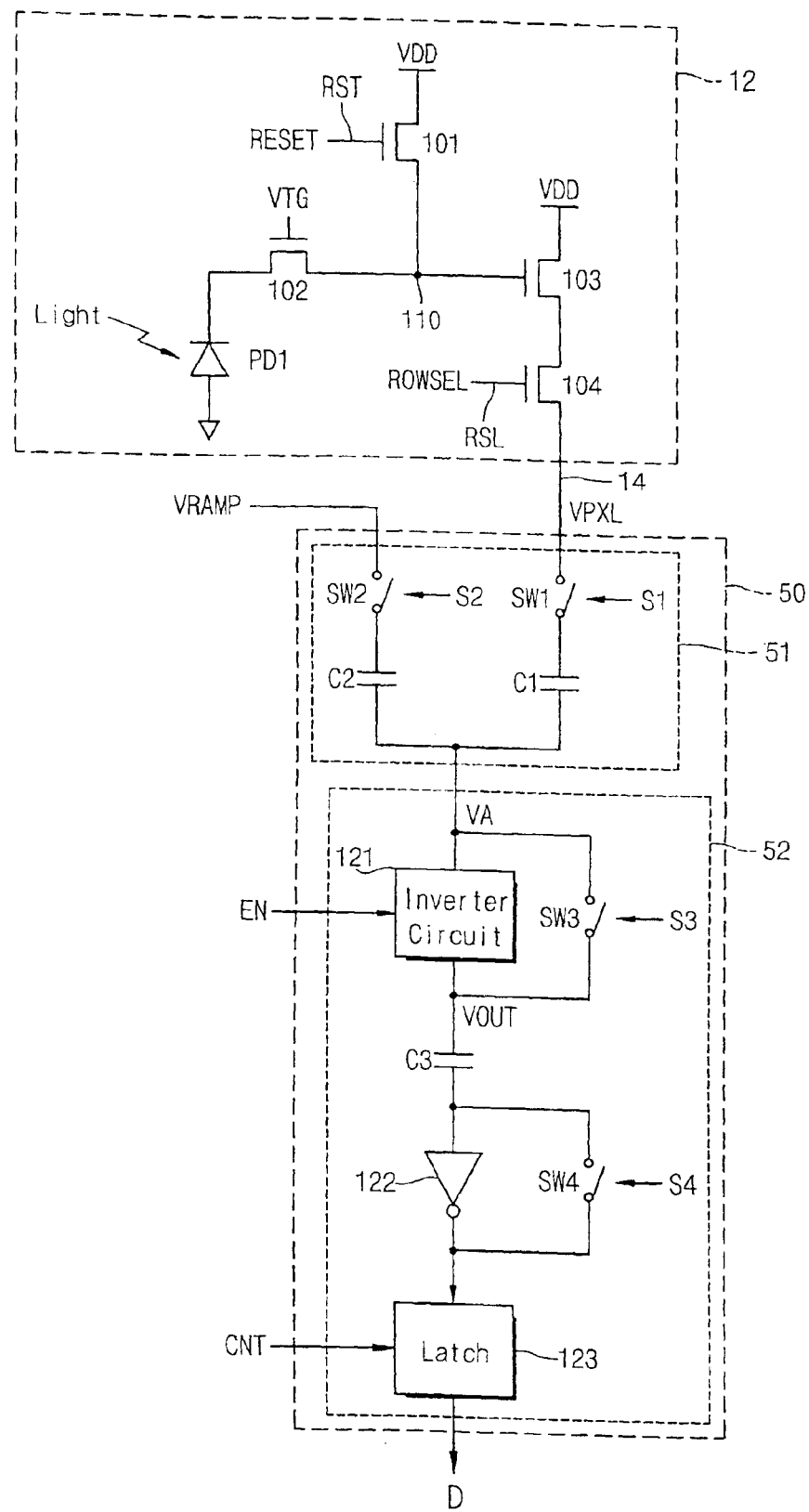
FIG. 2 shows the detailed circuit construction associated with one column of the CMOS image circuit shown in FIG. 1.

Circuit construction associated with one column of the CMOS image circuit shown in FIG. 1 is explained in detail as follows, with reference to FIG. 2. Referring to FIG. 2, a memory cell 12 includes NMOS transistors 101-104 and a photodiode PD1. The NMOS transistor 101 has a drain coupled to a power supply voltage VDD, a source coupled to a node 110, and a gate connected to a reset signal RESET through a reset signal line RST. The NMOS transistor 102 has a current path disposed between a cathode of the photodiode PD1 and the node 110, and a gate coupled to a voltage VTG. The anode of the photodiode PD1 is coupled to a ground voltage. The NMOS transistor 103 has a drain coupled to a power supply voltage VDD, a source, and a gate coupled to the node 110. The NMOS transistor 104 has a drain coupled to the source of the NMOS transistor 103, a source coupled to a node 14, and a gate connected to a row selection signal ROWSEL through a row selection line RSL.

When the photodiode PD1 is exposed to light, a voltage VPXL of the node 14 is determined according to intensity of the light. For example, as the intensity of the light becomes high, the voltage VPXL is lowered.

The analog-to-digital converter 50 includes a correlated double sampling (CDS) circuit 51 and an output circuit 52. The CDS circuit 51 has capacitors C1 and C2 and switches SW1 and SW2. One end of the capacitor C1 is coupled to the output circuit 52. The switch SW1 selectively connects the node 14 with the other end of the capacitor C1 in response to a switching signal S1. One end of the capacitor C2 is coupled to the output circuit 52. The switch SW2 selectively connects a ramp signal VRAMP from the ramp signal generator 30 with the other end of the capacitor C2. The switching signals S1 and S2 are provided from the timing and control logic block 20.

The output circuit 52 includes an inverter circuit 121, a capacitor C3, an inverter 122, switches SW3 and SW4, and a latch 123. The inverter circuit 121 has an input terminal for receiving an analog signal VA outputted from the CDS circuit 51 and an output terminal for outputting an output signal VOUT. The switch SW3 connects an input terminal of the inverter circuit 121 with an output terminal thereof in response to a switching signal S3. The capacitor C3 is coupled between the inverter circuit 121 and the inverter 122. The inverter 122 has an input terminal for receiving the output VOUT of the inverter circuit 121 and an output terminal. The switch SW4 connects an input terminal of the inverter 122 with an output terminal thereof. The latch 123 latches an output CNT of a counter 40, and outputs data word D. The switching signals S3 and S4 are provided from the timing and control logic block 20.

An inverter circuit according to a first embodiment of the invention is now described below with reference to FIG. 3. In the first embodiment, an enable signal EN is active high.

Figure 3:
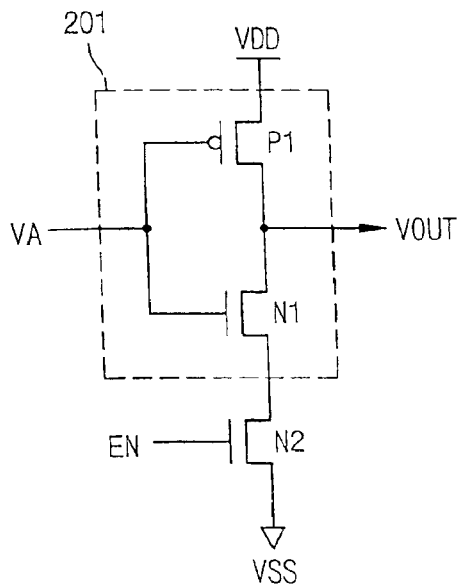
FIG. 3 shows an inverter circuit according to a first embodiment of the present invention.

Referring to FIG. 3, inverter circuit 121 includes an inverter 201 having a PMOS transistor P1 and an NMOS transistor N1, and includes an enable transistor N2. The enable transistor N2 is an NMOS transistor. The PMOS transistor P1 has a source coupled to a power supply voltage VDD, a drain coupled to an output terminal of the inverter circuit 121, and a gate coupled to an input terminal of the inverter circuit 121. The NMOS transistor N1 has a drain coupled to the output terminal of the inverter circuit 121, a source, and a gate coupled to the input terminal of the inverter circuit 121. The enable transistor N2 has a drain coupled to the source of the NMOS transistor N1, a source coupled to a ground voltage VSS, and a gate coupled to the enable signal EN provided from control logic block 20. When the enable signal is high, the inverter circuit 121 is enabled to receive an analog signal VA inputted to the input terminal of the inverter 121, and to invert and amplify the analog signal VA. On the other hand, when the enable signal is low, the inverter circuit 121 does not operate.

An inverter circuit according to a second embodiment of the invention is now described with reference to FIG. 4. In the second embodiment, an enable signal EN is active low.

Figure 4:
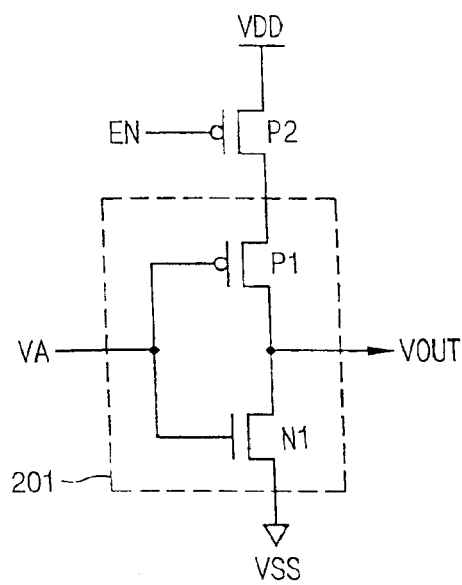
FIG. 4 shows an inverter circuit according to a second embodiment of the present invention.

Referring to FIG. 4, an inverter circuit 121 includes an inverter 201 having a PMOS transistor P1 and an NMOS transistor N1, and includes an enable transistor P2. The enable transistor P2 is a PMOS transistor. The PMOS transistor P2 has a source coupled to a power supply voltage VDD, a drain, and a gate coupled to the enable signal EN provided from a control logic block 20. The PMOS transistor P1 has a source coupled to the PMOS transistor P2, a drain coupled to an output terminal of the inverter circuit 121, and a gate coupled to an input terminal of the inverter circuit 121. The NMOS transistor N1 has a drain coupled to the output terminal of the inverter circuit 121, a source, and a gate coupled to the input terminal of the inverter circuit 121. When the enable signal EN is low, the inverter circuit 121 is enabled to receive an analog signal VA inputted to the input terminal of the inverter circuit 121, and to invert and amplify the analog signal VA. On the other hand, when the enable signal EN is high, the inverter circuit 121 does not operate.

The present invention will now be described more fully with regard to a preferred embodiment adopting the inverter circuit 121 shown in FIG. 3.

Figure 5:
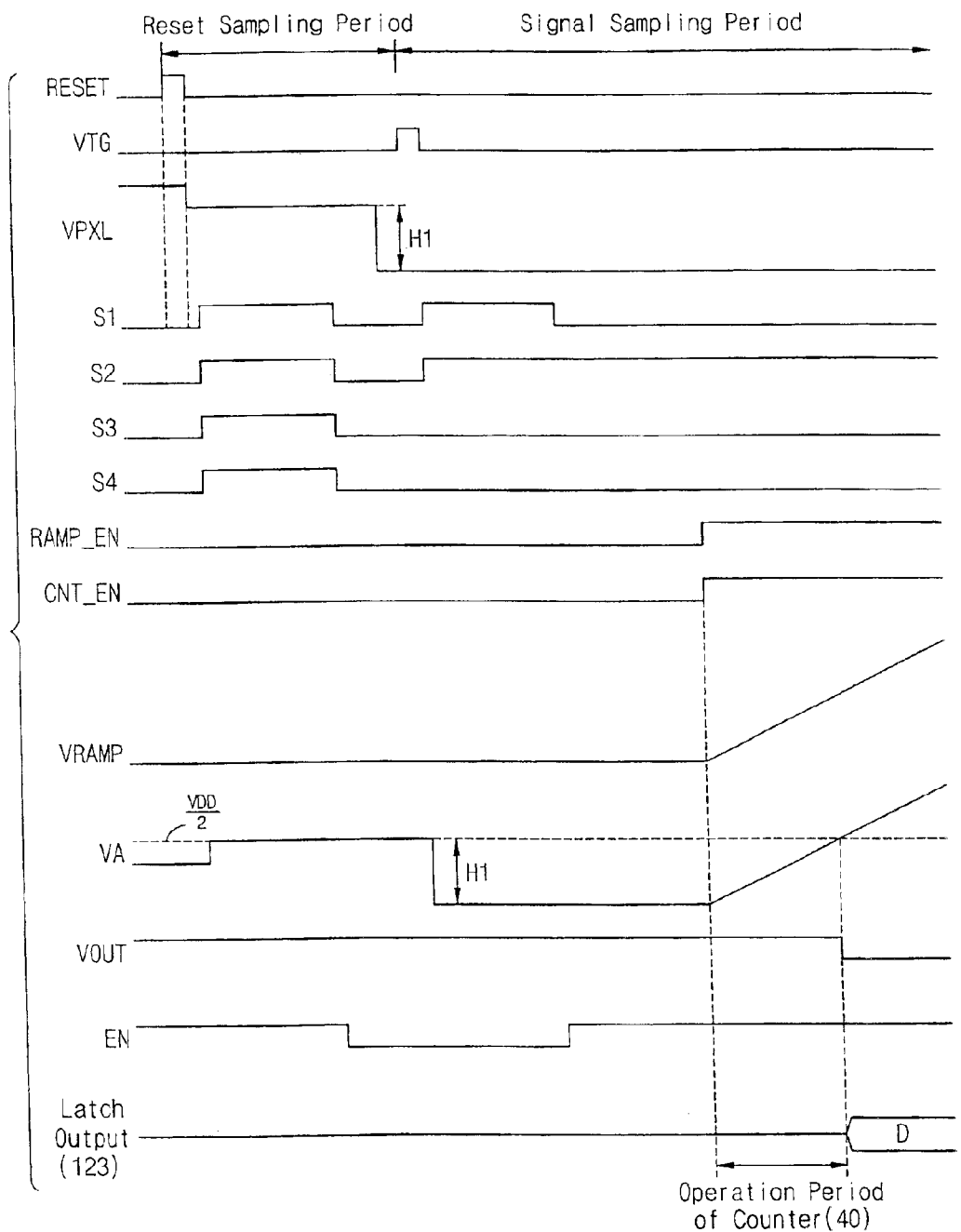
FIG. 5 shows a timing diagram of signals used in the CMOS image circuit according to the present invention.

A timing diagram of signals used in a CMOS image circuit according to an embodiment of the invention is illustrated in FIG. 5. With reference to FIG. 2, FIG. 3 and FIG. 5, in a reset sampling period when a reset signal RESET on a reset signal line RST provided from the timing and control logic block 20 is high, a potential of the node 110 is set to a voltage VDD-Vth that is defined by a threshold voltage of the NMOS transistor 101. A voltage VPXL of the node 14 increases in proportion to a voltage of the node 110. The voltage of the node 110 sets a gate potential of a source follower transistor 103. The transistor 103 amplifies a voltage applied to gate terminal of the transistor 103. When the row selection transistor 104 is turned on by the row selection signal ROWSEL on the row selection line RSL, the voltage of the node 110 is detected by the CDS circuit 51 which detects the corresponding voltage on the column line, and which provides the detected voltage to the output circuit 52.

In more detail, during the reset sampling period, the switches SW1, SW2, and SW3 are switched on in response to the switching signals S1, S2, and S3 of logic high, and the enable signal EN is high. Since the output VOUT of the inverter circuit 121 is fed back to the input terminal of inverter circuit 121, an analog signal VA inputted to the input terminal of the inverter circuit 121 is VDD/2. Although the switching signals S1, S2, and S3 subsequently become low, the analog signal VA is maintained at the VDD/2 level by way of the capacitor C1.

In a signal sampling period, as the voltage VTG becomes high, the charge of the node 110 is transmitted to the photodiode PD1. The voltage of the photodiode PD1 is in proportion to the intensity of light incident thereon. The voltage of the node 110 sets the gate potential of the source follower transistor 103, so that the voltage VPXL of the column line 14 is set to a voltage corresponding to the voltage of the node 110. The switches SW1 and SW2 are switched on in response to the switching signals S1 and S2 of logic high. The analog signal VA is equivalently lowered with the variation degree H1 of the voltage VPXL.

Subsequently, the switching signal S1 becomes low and the switching signal S2 is kept high. After the switching signal S1 becomes low, the ramp enable signal RAMP_EN and the counter enable signal CNT_EN are activated high. In response to the ramp enable signal RAMP_EN of logic high, the ramp signal generator 30 generates a ramp signal VRAMP rising with a constant inclination. Since the switching signal S2 is high, the analog signal VA rises with the same rate as the ramp signal VRAMP. In response to the counter enable signal CNT_EN of logic high, the counter 40 starts to count cycles of the counter enable signal CNT_EN of logic high.

Because the enable signal EN is deactivated low from a first falling edge to a second falling edge of the switching signal S1, the inverter circuit 121 does not operate during that period. If the inverter circuit 121 did not have the enable transistor N2, the source of the NMOS transistor N1 would have been directly coupled to the ground voltage VSS, and since the analog signal VA as inputted to the input terminal of the inverter circuit 121 is VDD/2, a current path would have been formed between the power supply voltage VDD and the ground voltage VSS through the PMOS transistor P1 and the NMOS transistor N1 of the inverter circuit 121. This would lead to an increase in power consumption of the inverter circuit 121. However, with the enable transistor N2 coupled between the source of the NMOS transistor N1 and the ground voltage VSS, unnecessary power consumption is suppressed. Although the inverter 121 is in a disabled state, there is no influence on the operation of the analog-to-digital converter 50, because the analog signal VA inputted to the input terminal of the inverter circuit 121 is stored in the capacitors C1 and C2.

Figure 6:
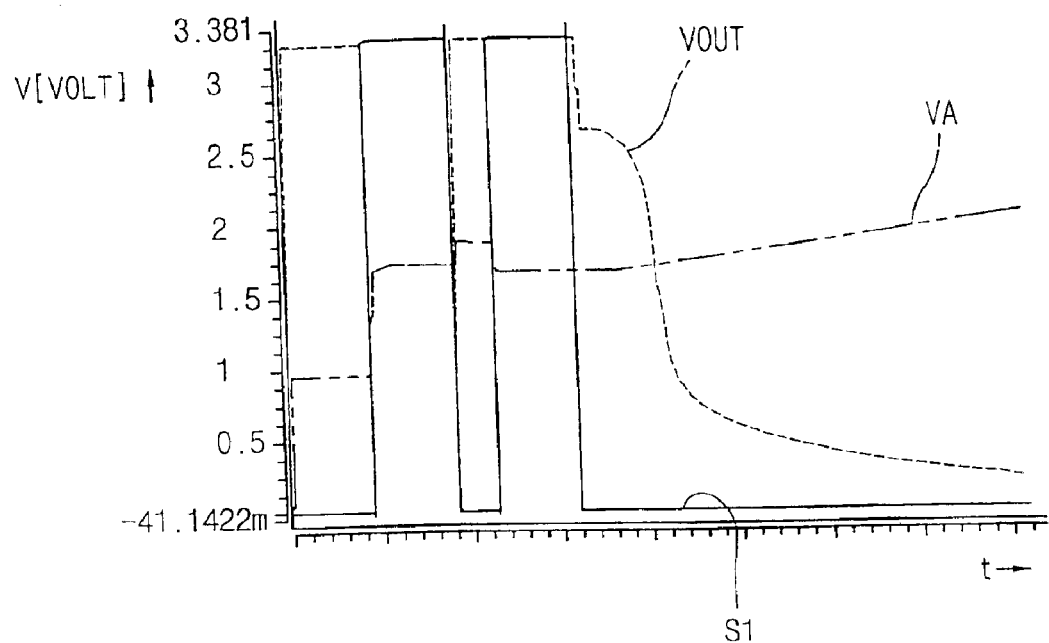
FIG. 6 shows part of signals input/output to/from the analog-to-digital converter shown in FIG. 2 when the analog-digital converter operates.

When the analog-to-digital converter 50 of FIG. 2 operates, part of signals inputted/outputted to/from the analog-to-digital converter 50 as illustrated in FIG. 6. Referring to FIG. 6, as the enable signal EN is deactivated low at the first falling edge of the switching signal S1, the output signal VOUT of the inverter circuit 121 becomes high. When the enable signal EN is activated high at the second falling edge of the switching signal S1, the inverter circuit 121 outputs an output signal VOUT according to the analog signal VA inputted to the input terminal of the inverter circuit 121.

Figure 7A:
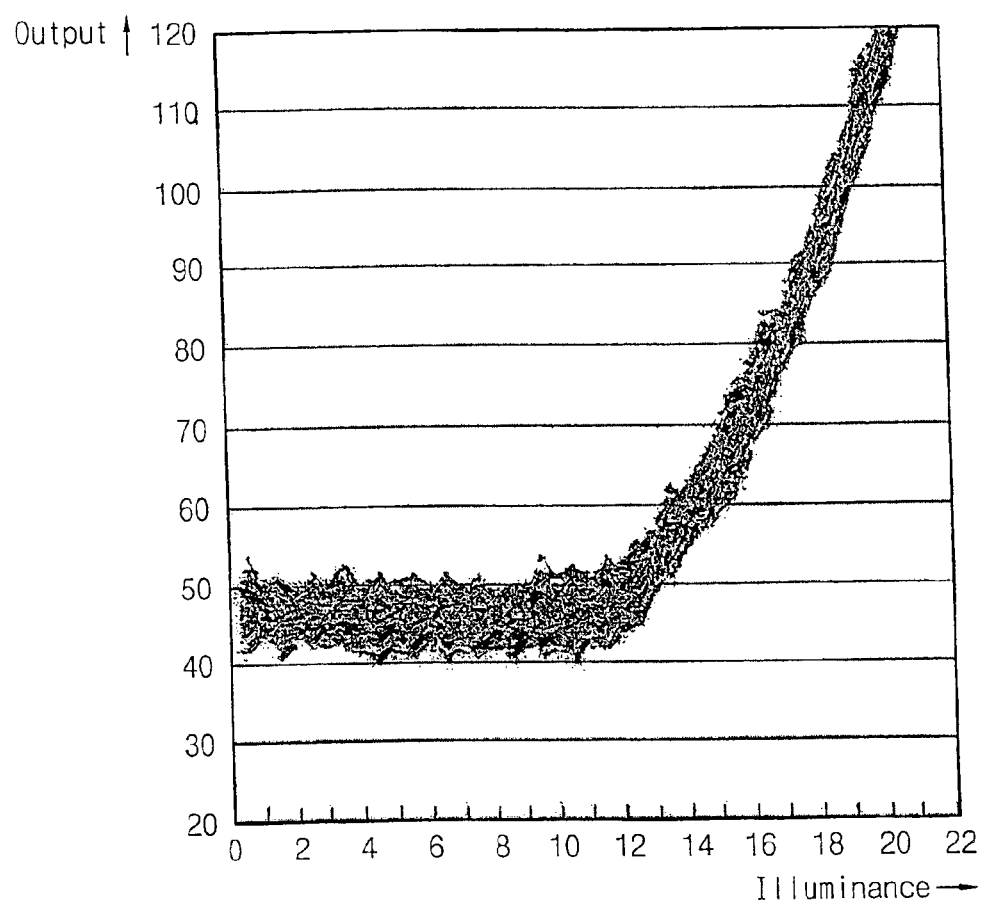
FIG. 7A shows output data based on the illuminance of light in the CMOS image circuit according to the present invention.
Figure 7B:
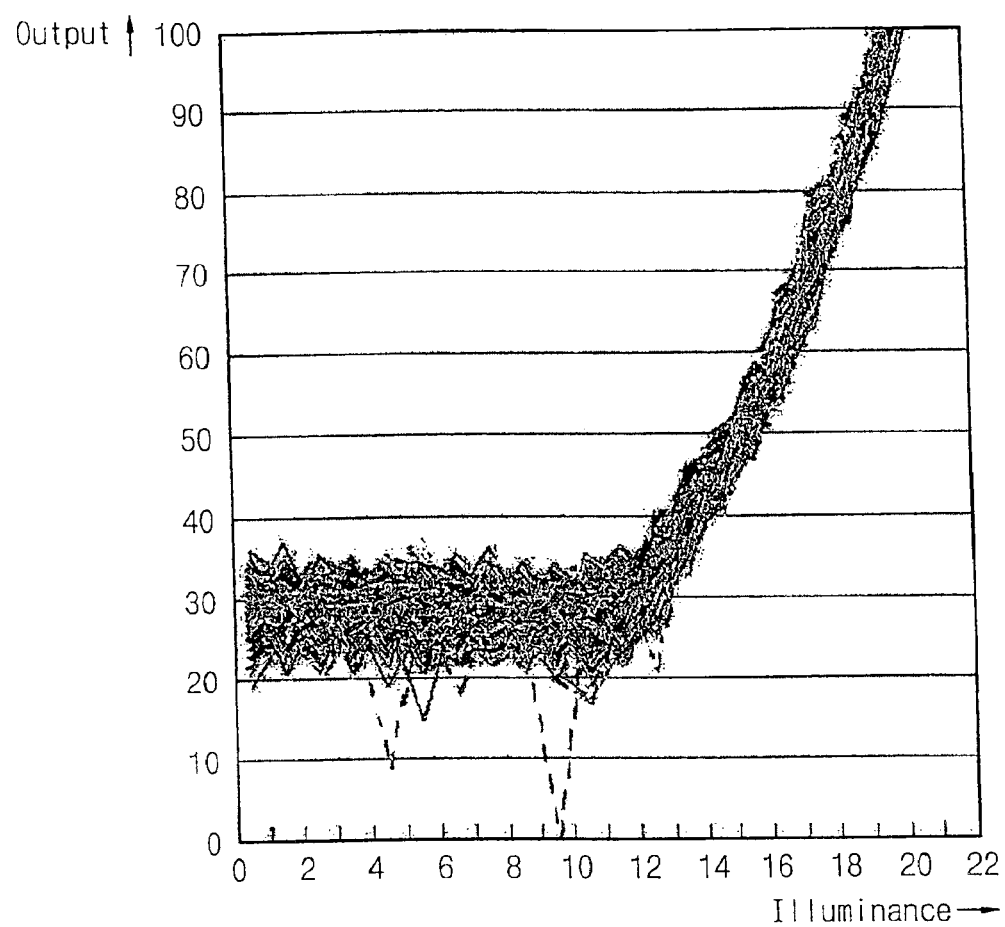
FIG. 7B shows output data based on the illuminance of light in an inverter circuit without an enable transistor.

FIG. 7A shows output data based on the illuminance of light in the CMOS image circuit according to the present invention, and FIG. 7B shows output data based on the luminance of light in an inverter circuit without an enable transistor. In view of FIG. 7A and FIG. 7B, it sould be understood that the enable transistor (N2 of FIG. 3 and P2 of FIG. 4), stabilizes operation of the inverter circuit 121.

According to the present invention, the power consumption of an analog-to-digital converter is reduced. As a result, the power consumption of a CMOS image device is reduced.

While the present invention has been illustrated and described with regard to particular embodiments thereof, it will be understood that numerous modifications and substitutions may be made to the embodiments described and that numerous other embodiments of the invention may be implemented without departing from the spirit and scope of the invention as defined in the following claims.

What is claimed is:

1. A signal processing circuit comprising:
    an analog integrated circuit having a first input terminal that receives a first-level analog signal during a first active period of a first switching signal and a second input terminal that receives a time varying reference signal, the first input terminal being coupled to a data line to receive a second-level analog signal corresponding to image charges of an image input element during a second active period of the first switching signal;
    an inverter circuit that inverts and amplifies an output of said analog integrated circuit in response to an activated enable signal; and
    an output circuit that generates a digital word indicative of a time period defined by a start signal and an end signal corresponding to a transition of an output of said inverter circuit,
    wherein the enable signal is deactivated between an end point of the first active period and an end point of the second active period of the first switching signal.

2. The signal processing circuit of claim 1, wherein said inverter circuit comprises:
    a first transistor having a first electrode coupled to a power supply voltage, a second electrode, and a gate coupled to the output of said analog integrated circuit;
    a second transistor having a first electrode coupled to the second electrode of the first transistor, a second electrode, and a gate coupled to the output of said analog integrated circuit; and
    a third transistor having a first electrode coupled to the second electrode of the second transistor, a second electrode coupled to a ground voltage, and a gate coupled to the enable signal.

3. The signal processing circuit of claim 2, wherein the first transistor is a PMOS transistor, and the second and third transistors are NMOS transistors.

4. The signal processing circuit of claim 3, wherein the enable signal is active high.

5. The signal processing circuit of claim 1, wherein said inverter circuit comprises:
- a first transistor having a first electrode coupled to a power supply voltage, a second electrode, and a gate coupled to the enable signal;
- a second transistor having a first electrode coupled to the second electrode of the first transistor, a second electrode, and a gate coupled to the output of said analog integrated circuit; and
- a third transistor having a first electrode coupled to the second electrode of the second transistor, a second electrode coupled to a ground voltage gate, and a gate coupled to the output of said analog integrated circuit.

6. The signal processing circuit of claim 5, wherein the first and second transistors are PMOS transistors, and the third transistor is an NMOS transistor.

7. The signal processing circuit of claim 6, wherein the enable signal is active low.

8. The signal processing circuit of claim 1, wherein the time varying reference signal is a ramp signal varied with a predetermined inclination in response to the start signal.

9. The signal processing circuit of claim 1, wherein said analog integrated circuit comprises:
- a first switch having a first terminal coupled to the first input terminal, and having a second terminal, the first switch being switchable responsive to the first switching signal;
- a first capacitor having a first electrode coupled to the second terminal of the first switch, and having a second electrode coupled to an output terminal of said analog integrated circuit;
- a second switch having a first terminal coupled to the second input terminal, and having a second terminal, the second switch being switchable responsive to a second switching signal; and
- a second capacitor having a first electrode coupled to the second terminal of the second switch, and having a second electrode coupled to the output terminal of said analog integrated circuit.

10. A signal processing circuit comprising:
- a sensor that provides a sensor signal at a sensor output terminal;
- a sampling circuit having a first switch coupled between the sensor output terminal and a first electrode of a first capacitor, and a second switch coupled between a time varying reference signal and a first electrode of a second capacitor, wherein second electrodes of the first and second capacitors are coupled to an output terminal of said sampling circuit, and wherein the first and second switches are respectively controlled by first and second switching signals;
- an inverter circuit that inverts and amplifies a sampled signal provided at the output terminal of said sampling circuit, responsive to an activated enable signal; and
- an output circuit that generates a digital word responsive to an output of said inverter circuit.

11. The signal processing circuit of claim 10, wherein the enable signal is deactivated at a timing in accordance with the first switching signal.

12. The signal processing circuit of claim 10, wherein said sensor provides a first-level analog signal as the sensor signal during a first active period of the first switching signal, and provides a second-level analog signal corresponding to sensor image charges as the sensor signal during a second active period of the first switching signal.

13. The signal processing circuit of claim 12, wherein the enable signal is deactivated between an end point of the first active period and an end point of the second active period.

14. The signal processing circuit of claim 10, wherein said inverter circuit comprises:
- a first transistor having a first electrode coupled to a power supply voltage, a second electrode, and a gate coupled to the output terminal of said sampling circuit;
- a second transistor having a first electrode coupled to the second electrode of the first transistor, a second electrode, and a gate coupled to the output terminal of said sampling circuit; and
- a third transistor having a first electrode coupled to the second electrode of the second transistor, a second electrode coupled to a ground voltage, and a gate coupled to the enable signal.

15. The signal processing circuit of claim 14, wherein the first transistor is a PMOS transistor, and the second and third transistors are NMOS transistors.

16. The signal processing circuit of claim 15, wherein the enable signal is active high.

17. The signal processing circuit of claim 10, wherein said inverter circuit comprises:
- a first transistor having a first electrode coupled to a power supply voltage, a second electrode, and a gate coupled to the enable signal;
- a second transistor having a first electrode coupled to the second electrode of the first transistor, a second electrode, and a gate coupled to the output terminal of said sampling circuit; and
- a third transistor having a first electrode coupled to the second electrode of the second transistor, a second electrode coupled to a ground voltage, and a gate coupled to the output terminal of said sampling circuit.

18. The signal processing circuit of claim 17, wherein the first and second transistors are PMOS transistors, and the third transistor is an NMOS transistor.

19. The signal processing circuit of claim 18, wherein the enable signal is active low.

20. The signal processing circuit of claim 10, wherein the time varying reference signal is a ramp signal varied with a predetermined inclination.

* * * * *